United States Patent
Lin

(10) Patent No.: US 10,943,868 B2
(45) Date of Patent: Mar. 9, 2021

(54) STRUCTURE FOR INTERCONNECTION

(71) Applicant: Taiwan Semiconductor Manufacturing Co., Ltd., Hsin-Chu (TW)

(72) Inventor: Hsiang-Wei Lin, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/853,136

(22) Filed: Apr. 20, 2020

(65) Prior Publication Data

US 2020/0251418 A1 Aug. 6, 2020

Related U.S. Application Data

(60) Continuation of application No. 15/888,130, filed on Feb. 5, 2018, now Pat. No. 10,269,534, which is a
(Continued)

(51) Int. Cl.
*H01L 23/48* (2006.01)
*H01L 23/532* (2006.01)
(Continued)

(52) U.S. Cl.
CPC .... *H01L 23/53238* (2013.01); *H01L 21/3105* (2013.01); *H01L 21/31111* (2013.01);
(Continued)

(58) Field of Classification Search
CPC ........... H01L 23/53295; H01L 23/5222; H01L 23/528; H01L 23/5226; H01L 23/53238; H01L 23/522; H01L 23/53228; H01L 23/485; H01L 23/564; H01L 23/535; H01L 23/5329; H01L 21/76825; H01L 21/67115; H01L 21/3105; H01L 21/764; H01L 21/76802; H01L 21/76843;
(Continued)

(56) References Cited

U.S. PATENT DOCUMENTS 7,112,526 B2 * 9/2006 Okada ............... H01L 21/76807
257/E21.576
7,667,271 B2 2/2010 Yu et al.
(Continued)

FOREIGN PATENT DOCUMENTS

TW 201526106 7/2015
TW 201532226 8/2015

*Primary Examiner* — Shouxiang Hu
(74) *Attorney, Agent, or Firm* — Haynes and Boone, LLP

(57) ABSTRACT

A semiconductor structure includes a first low-k dielectric layer disposed over a semiconductor substrate, a first conductive feature and a second conductive feature disposed in the first low-k dielectric layer, a second low-k dielectric layer disposed in the first low-k dielectric layer and interposed between the first conductive feature and the second conductive feature, where the second low-k dielectric layer includes an air gap, and an etch-stop layer disposed at an interface between the first low-k dielectric layer and the second low-k dielectric layer. The first low-k dielectric layer includes carbon whose concentration is graded in a direction away from the etch-stop layer.

16 Claims, 19 Drawing Sheets

Related U.S. Application Data division of application No. 15/276,456, filed on Sep. 26, 2016, now Pat. No. 9,887,128.

(60) Provisional application No. 62/272,414, filed on Dec. 29, 2015.

(51) Int. Cl.

| | | |
|---|---|---|
| *H01L 23/528* | (2006.01) | |
| *H01L 21/311* | (2006.01) | |
| *H01L 21/768* | (2006.01) | |
| *H01L 21/67* | (2006.01) | |
| *H01L 21/764* | (2006.01) | |
| *H01L 23/522* | (2006.01) | |
| *H01L 21/3105* | (2006.01) | |
| *H01L 23/485* | (2006.01) | |
| *H01L 23/00* | (2006.01) | |
| *H01L 23/535* | (2006.01) | |

(52) U.S. Cl.
CPC .. *H01L 21/31144* (2013.01); *H01L 21/67063* (2013.01); *H01L 21/67115* (2013.01); *H01L 21/764* (2013.01); *H01L 21/7682* (2013.01); *H01L 21/76802* (2013.01); *H01L 21/76825* (2013.01); *H01L 21/76843* (2013.01); *H01L 23/485* (2013.01); *H01L 23/522* (2013.01); *H01L 23/528* (2013.01); *H01L 23/5222* (2013.01); *H01L 23/5226* (2013.01); *H01L 23/535* (2013.01); *H01L 23/5329* (2013.01); *H01L 23/53228* (2013.01); *H01L 23/53295* (2013.01); *H01L 23/564* (2013.01)

(58) Field of Classification Search
CPC ......... H01L 21/31111; H01L 21/31144; H01L 21/67063; H01L 21/7682
See application file for complete search history.

(56) References Cited

U.S. PATENT DOCUMENTS

| | | | |
|---|---|---|---|
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,685,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,330,963 | B2 * | 5/2016 | King ................. H01L 21/76831 |
| 2003/0183940 | A1 | 10/2003 | Noguchi et al. |
| 2004/0097065 | A1 | 5/2004 | Lur et al. |
| 2009/0115061 | A1 | 5/2009 | Chen et al. |
| 2010/0261349 | A1 | 10/2010 | Van Schravendijk et al. |
| 2011/0117678 | A1 | 5/2011 | Varadarajan et al. |
| 2014/0001574 | A1 | 1/2014 | Chen et al. |
| 2014/0110755 | A1 | 4/2014 | Colinge |
| 2014/0151812 | A1 | 6/2014 | Liaw |
| 2015/0303140 | A1 | 10/2015 | Lin |
| 2016/0276260 | A1 | 9/2016 | Liou et al. |
| 2017/0186683 | A1 | 6/2017 | Lin |

* cited by examiner

STRUCTURE FOR INTERCONNECTION

PRIORITY DATA

This is a continuation application of U.S. patent application Ser. No. 15/888,130 filed Feb. 5, 2018, which is a divisional application claiming benefits of U.S. patent application Ser. No. 15/276,456, now U.S. Pat. No. 9,887,128, filed Sep. 26, 2016, which claims benefits of U.S. Provisional Application No. 62/272,414 entitled "Method and Structure for Interconnection," filed Dec. 29, 2015, the entirety of each disclosure being herein incorporated by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

ICs may include electronic components, such as transistors, capacitors, or the like, formed on a substrate. Interconnect structures, such as vias and conductive lines, are then formed over the electronic components to provide connections between the electronic components and to provide connections to external devices. To reduce the parasitic capacitance of the interconnect structures, the interconnect structures may be formed in dielectric layers including a low-k dielectric material. In the formation of the interconnect structures, the low-k dielectric material may be etched to form trenches and via openings. However, the etching of low-k dielectric may cause damages to the low-k dielectric material, which leads to leakage issues. Accordingly, what is needed is a circuit structure and a method making the same to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
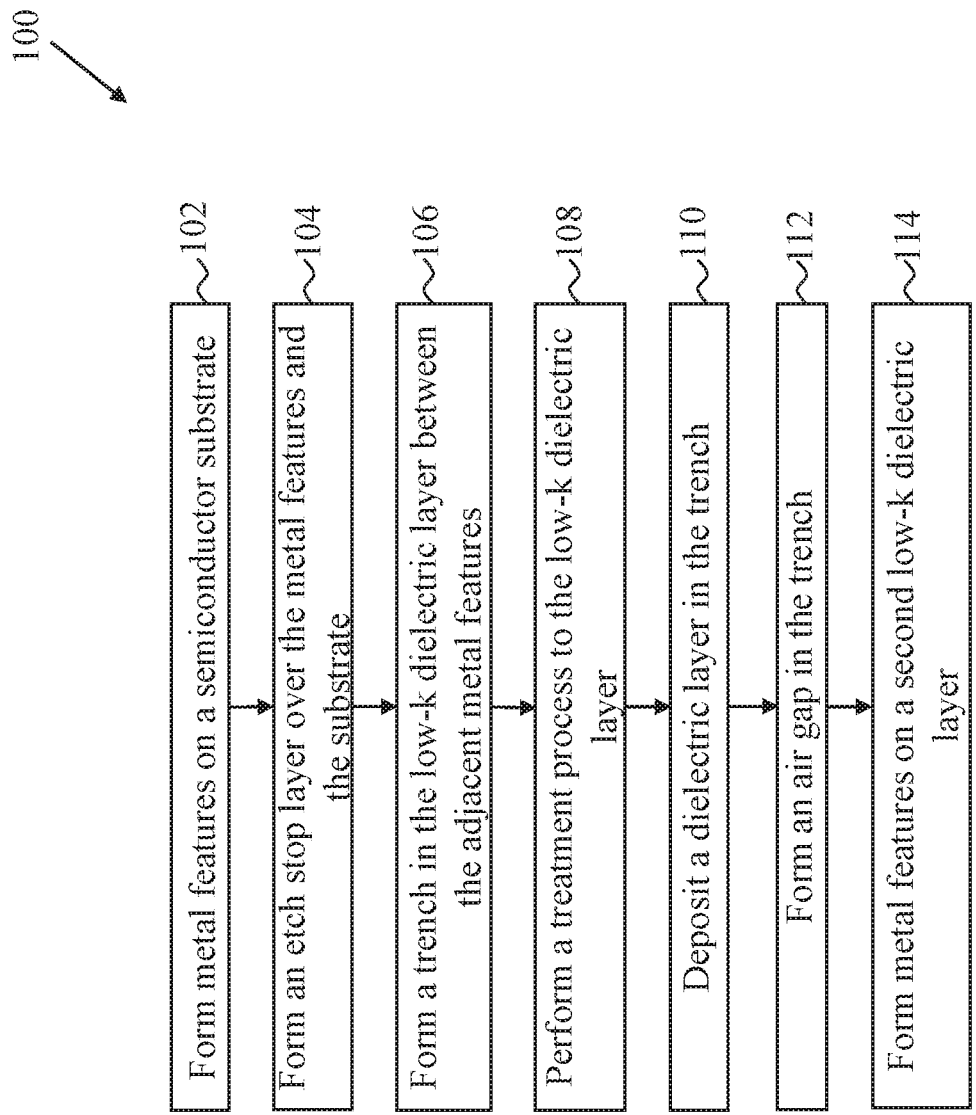
FIG. 1 is a flowchart illustrating an embodiment of a method of forming a semiconductor device or portion thereof according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
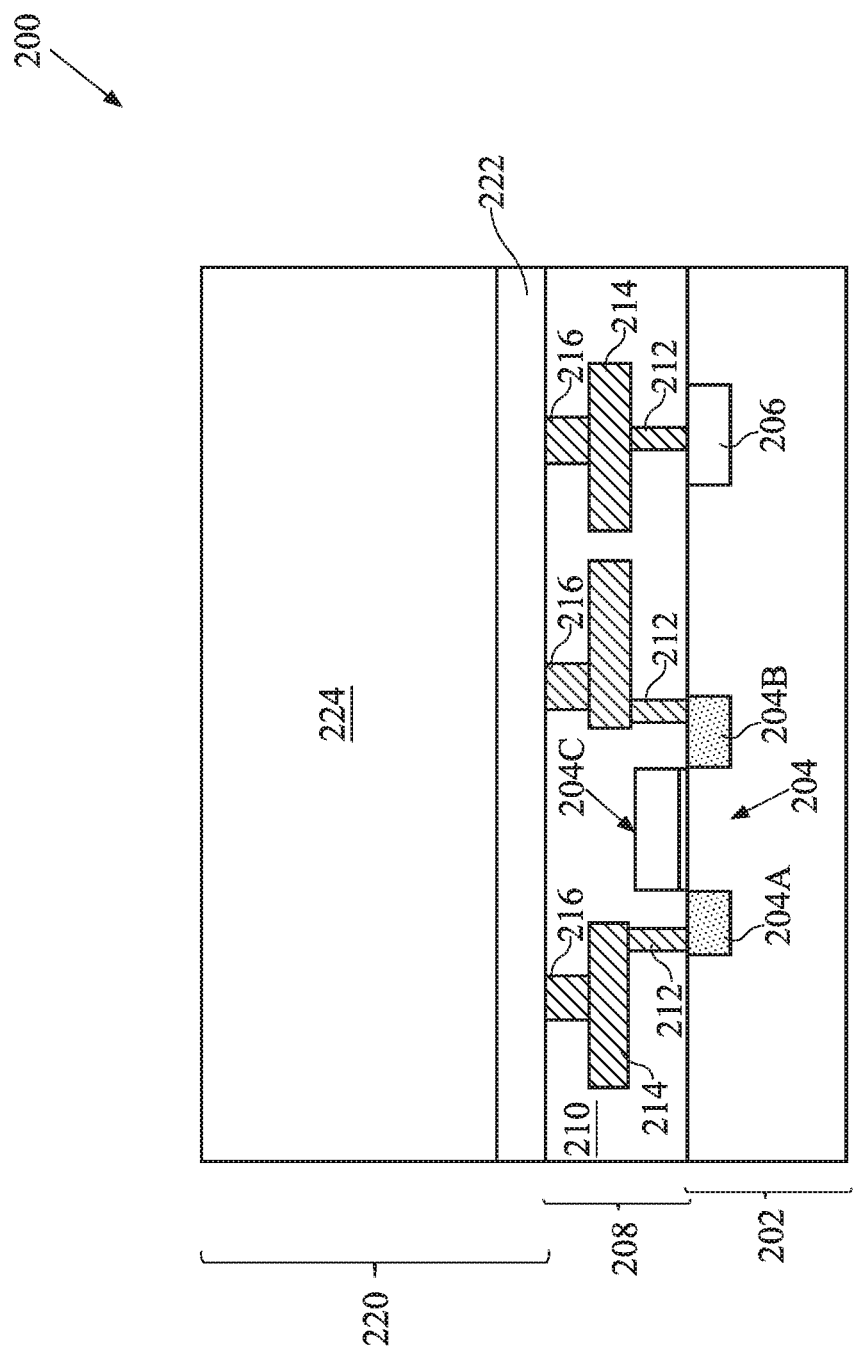
FIGS. 2, 3A, 4, 5A, 5C, 6, 11, 12A, 12B, 13A and 13B are cross-sectional views of a semiconductor structure at various fabrication stages constructed according to some embodiments.

Referring now to FIG. 1, illustrated therein is a flowchart of one embodiment of a method 100 used to fabricate a semiconductor structure. FIG. 2 is a sectional view of a semiconductor structure 200 during various fabrication stages and constructed according to various aspects of the present disclosure in one or more embodiments. The method 100 and the IC structure 200 are collectively described below with reference to FIGS. 1, 2 and other figures.

The method 100 includes an operation 102 to form metal features on a semiconductor substrate 202. The semiconductor substrate 202 includes silicon. Alternatively or additionally, the substrate 202 may include other elementary semiconductor such as germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding. The substrate 202 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), an imaging sensor, a light emitting diode (LED), various memory devices, or a combination thereof. The substrate 202 may further include other functional features such as a resistor or a capacitor formed in and on the substrate. The substrate 202 further includes lateral isolation features provided to separate various devices formed in the substrate 202. In one embodiment, shallow trench isolation (STI) features are used for lateral isolation.

In some embodiments, the substrate 202 is not a flat and has a three dimensional profile of the active regions, such as a fin-like active region. The fin-like active region extended above the STI features. The formation of the fin-like active region includes forming STI features in the substrate, and then recessing the STI features by selective etch or growing the active region by selective epitaxy growth (SEG). A field effect transistor formed on the fin-like active region is also referred to as a fin FET (FinFET).

In FIG. 2, illustrated is an exemplary field effect transistor 204 that includes a source 204A, a drain 204B, and a gate stack 204C interposed between the source and drain. Another exemplary device or structure 206 is schematically shown in FIG. 2. The semiconductor device 206 formed in or on the substrate 202 may include active components such as FETs or Bipolar Junction Transistors (BJTs), or passive components such as resistors, capacitors, or inductors. The semiconductor structure 200 may include millions or billions of these semiconductor devices, but only a few are shown in FIG. 2 for the sake of simplicity.

A plurality of dielectric layers and conductive features may be integrated to form an interconnection structure configured to couple the various p-type and n-type doped regions and the other functional features (such as gate electrodes), resulting in a functional integrated circuit. The interconnection structure includes a multi-layer interconnect (MLI) structure and an inter-level dielectric (ILD) integrated with the MLI structure, providing an electrical routing to couple various devices in the substrate 202 to the input/output power and signals. The interconnection structure includes various metal lines, contacts and vias (or via plugs). The metal lines provide horizontal electrical routing. The contacts provide vertical connection between the substrate and metal lines while via features provide vertical connection between metal lines in different metal layers.

In the present example, the semiconductor structure 200 may include a portion 208 (a subset) of the interconnection structure, such as one or two metal layers. In the flowing description, the portion 208 of the interconnection structure is simply referred to as interconnection structure 208. As illustrated in the example of FIG. 2, in some embodiments, the interconnect structure 208 is formed over the substrate 202. The interconnect structure 208 includes a plurality of patterned dielectric layers and connective layers that provide interconnections (e.g., wiring) between the various doped features, circuitry, and input/output of the semiconductor structure 200. For example, the interconnect structure 208 includes an interlayer dielectric (ILD) 210 and various conductive features formed in the ILD. The ILD 210 may include silicon oxide, low-k dielectric material, other suitable dielectric materials, or combinations thereof. For purposes of illustration, the interconnection structure 208 includes contacts 212, metal lines 214 and vias 216 coupled to various devices on the substrate 202. It is noted that the contacts 212, conductive lines 214 and vias 216 illustrated are merely exemplary, and the actual positioning, quantity, and configuration of the conductive lines and contacts/vias may vary depending on design and manufacturing needs. The interconnection structure 208 includes conductive lines formed by suitable methods including physical vapor deposition (PVD), chemical vapor deposition (CVD), atomic layer deposition (ALD), plating, sputtering, other suitable processes and a combination thereof. The interconnection structure 208 may be defined by suitable processes such as photolithography and etching processes. The conductive lines and/or vias of the interconnection structure 208 may include multiple layers such as, barrier layers, seed layers, adhesion layers, and/or other suitable features. In some embodiments, the interconnection structure 208 includes conductive lines 214 of copper. Other suitable compositions for the interconnection structure 208 includes aluminum, aluminum/silicon/copper alloy, metal silicide (such as nickel silicide, cobalt silicide, tungsten silicide, tantalum silicide, titanium silicide, platinum silicide, erbium silicide, palladium silicide, or combinations thereof), copper alloy, titanium, titanium nitride, tantalum, tantalum nitride, tungsten, polysilicon, gold, silver, and/or combinations thereof. The formation of the metal lines 214 may include a damascene process, such as single damascene or dual damascene. In some embodiments, the formation of the metal lines may include a procedure similar to that used in this method to form metal lines in the overlying metal layer, which will be described later.

A dielectric layer 220 is formed on the substrate 202. In some embodiments, the dielectric layer 220 includes an etch stop layer 222 and a low-k dielectric layer 224 formed over the substrate 202, such as on the interconnection structure 208. In some embodiments, the etch stop layer 222 is disposed over the interconnect structure 208. Alternatively, the interconnect structure 208 may be omitted in the semiconductor structure 200, and the etch stop layer 222 may be formed directly over the substrate 202. The etch stop layer 222 may include a dielectric material, such as silicon nitride, silicon oxynitride, silicon carbide, other suitable materials, and/or a combination thereof. In some examples, the etch stop layer 222 may include multiple layers, such as a silicon nitride layer, a silicon carbon nitride layer, a silicon oxynitride layer, other suitable layers, and/or a combination thereof.

The low-k dielectric layer 224 is formed over the etch stop layer 222. The low-k dielectric layer 224 may be formed by depositing a low-k dielectric material over the etch stop layer 222. Low-k materials may include dielectric materials that have a dielectric constant (k) lower than that of $SiO_2$ (e.g., 3.9). The low-k dielectric material may include carbon containing materials, organo-silicate (OSG) glass, porogen-containing materials, a hydrogen silsesquioxane (HSQ) dielectric material, a methylsilsesquioxane (MSQ) dielectric material, a carbon doped oxide (CDO) dielectric material, a hydrogenated silicon oxy-carbide (SiCOH) dielectric material, a benzocyclobutene (BCB) dielectric material, an arylcyclobutene based dielectric material, a polyphenylene based dielectric material, other suitable materials, and/or a combination thereof.

In various embodiments, the low-k dielectric layer 224 may be deposited using a chemical vapor deposition (CVD) method, plasma enhanced CVD (PECVD), low pressure CVD (LPCVD), atomic layer chemical vapor deposition (ALCVD), spin-on coating, and/or other suitable deposition processes. In some embodiments, the low-k dielectric 224 may have a thickness between 20 nm and 200 nm. In some embodiments, the height is between 40 nm and 60 nm.

Figure 3A:
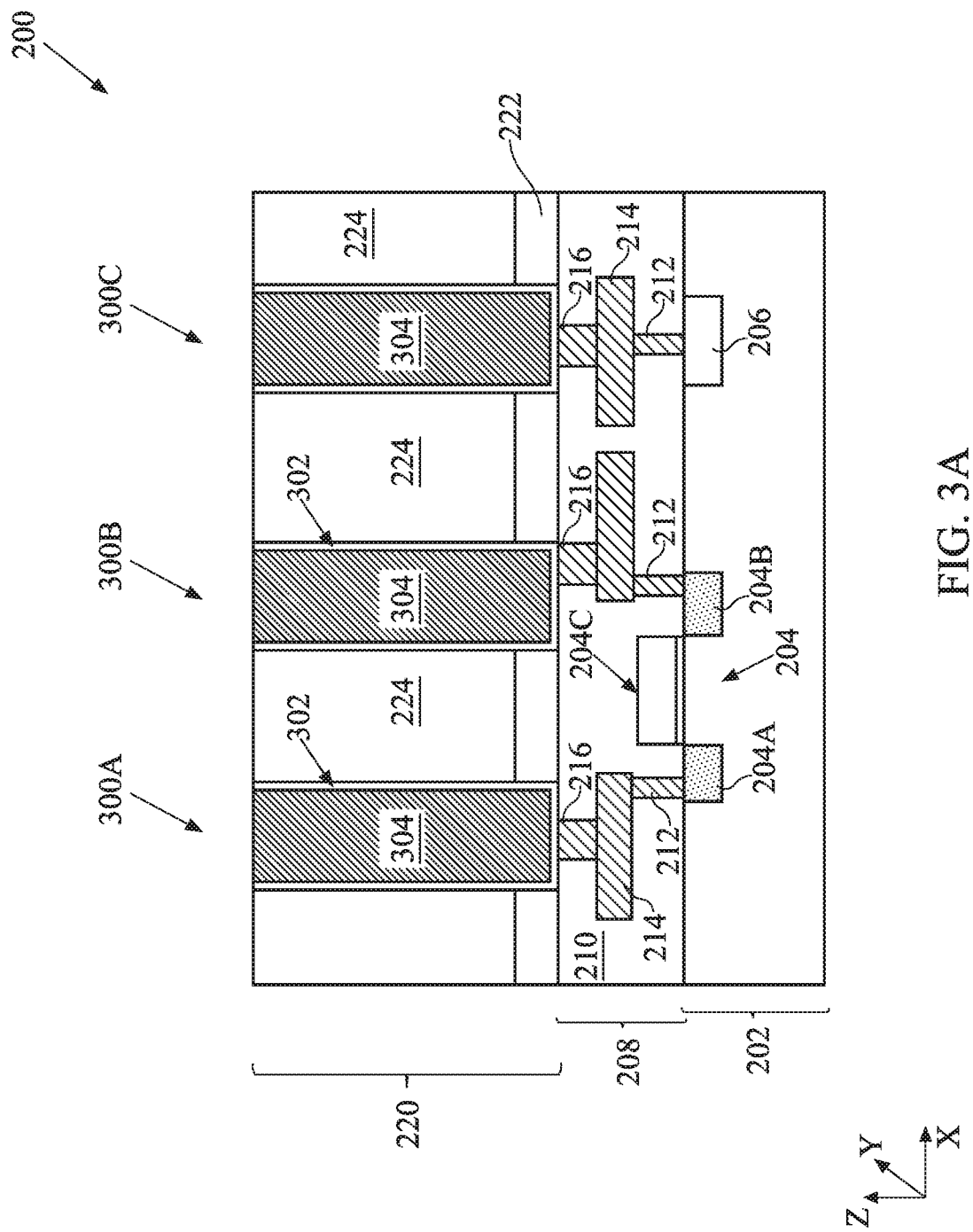
Figure 3B:
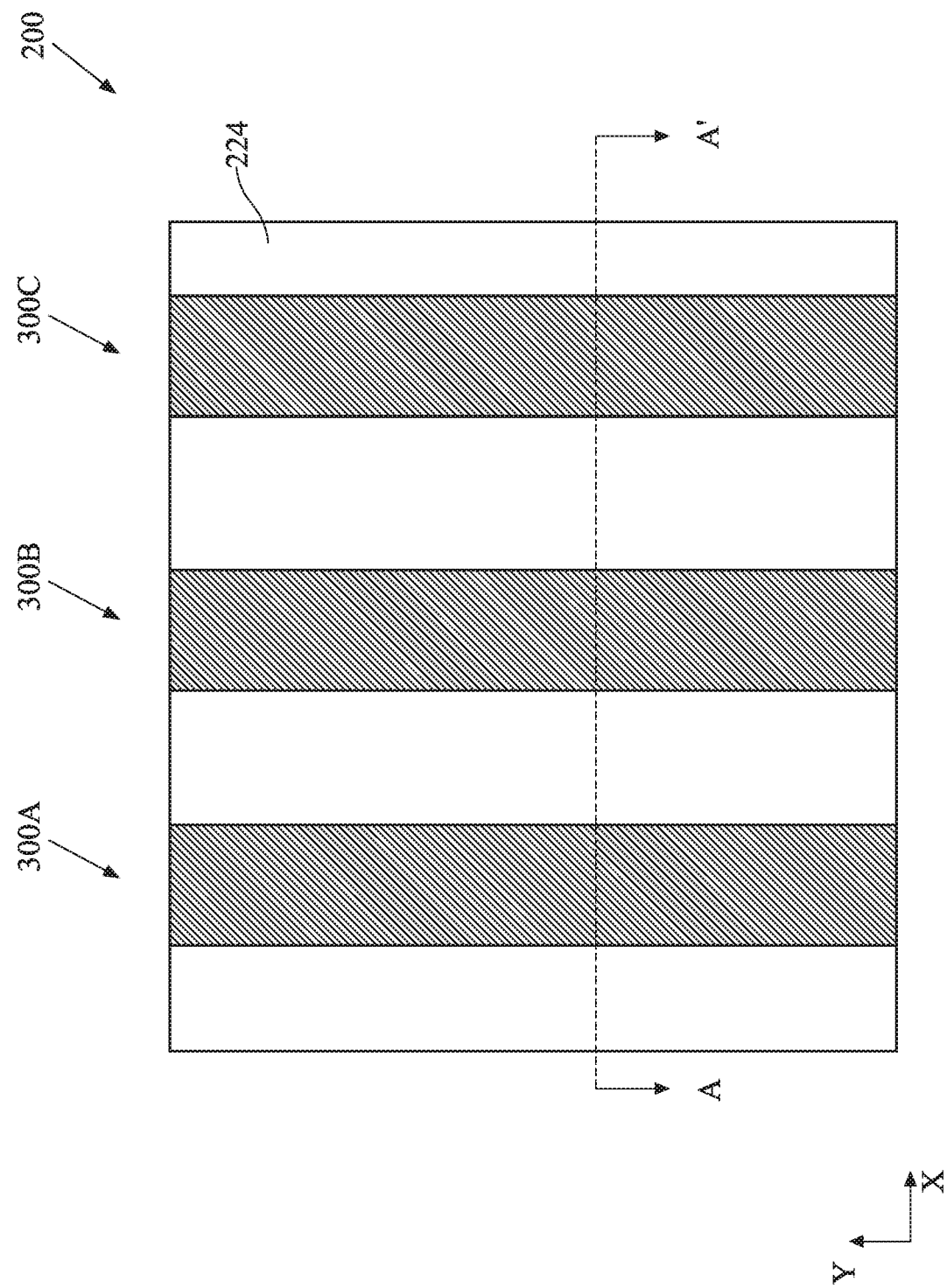
FIGS. 3B, 5B and 12C are top views of a semiconductor structure at various fabrication stages constructed according to some embodiments.

In the operation 102, metal features 300 are formed in the dielectric layer 220, as illustrated in FIG. 3A. In FIG. 3A, three exemplary metal features 300A, 300B and 300C are illustrated. In some embodiments, the metal features are metal lines in an overlying metal layer. FIG. 3B is a top view of the semiconductor structure 200 in portion, constructed in accordance with some embodiments. FIG. 3A is the sectional view of FIG. 3B along the dashed line AA'. In the present embodiment, the metal lines 300 are spaced away from each other in X direction and are oriented along Y direction.

Similarly, the formation of the metal features 300 may include patterning the dielectric layer 224 to form trenches in the dielectric layer 224; filling the trenches with a metal material; and performing a chemical mechanical polishing (CMP) process to planarize the top surface and remove the excessive metal material. In some embodiments, the patterning process includes forming a patterned resist layer; and etching the underlying material layer using the patterned resist layer as an etch mask. The patterned resist layer may be removed afterward. The patterned resist layer is formed by a lithography process that may include coating a resist layer; exposing the resist layer by a radiation (such as ultraviolet radiation); post exposure baking and developing. The lithography processes described above may only present a subset of processing steps associated with a lithography patterning technique. The lithography process may further include other steps such as cleaning and baking in a proper sequence.

Similar to the metal lines 214, the metal features 300 may include copper, aluminum, tungsten, other suitable metal or metal alloy or a combination thereof. The metal features 300 may include multiple layers, such as a barrier layer 302 lining in the trenches and a bulky metal 304 filled in the lined trenches. The barrier layer 302 may include titanium, titanium nitride, tantalum, tantalum nitride or a combination thereof. In some examples, the barrier layer 302 is deposited by PVD, ALD or other suitable technique. In some other examples, the bulky metal 304 is deposited by a procedure that includes plating to form a seed layer, and plating to further deposit on the seed layer, thereby filling the trenches.

Figure 4:
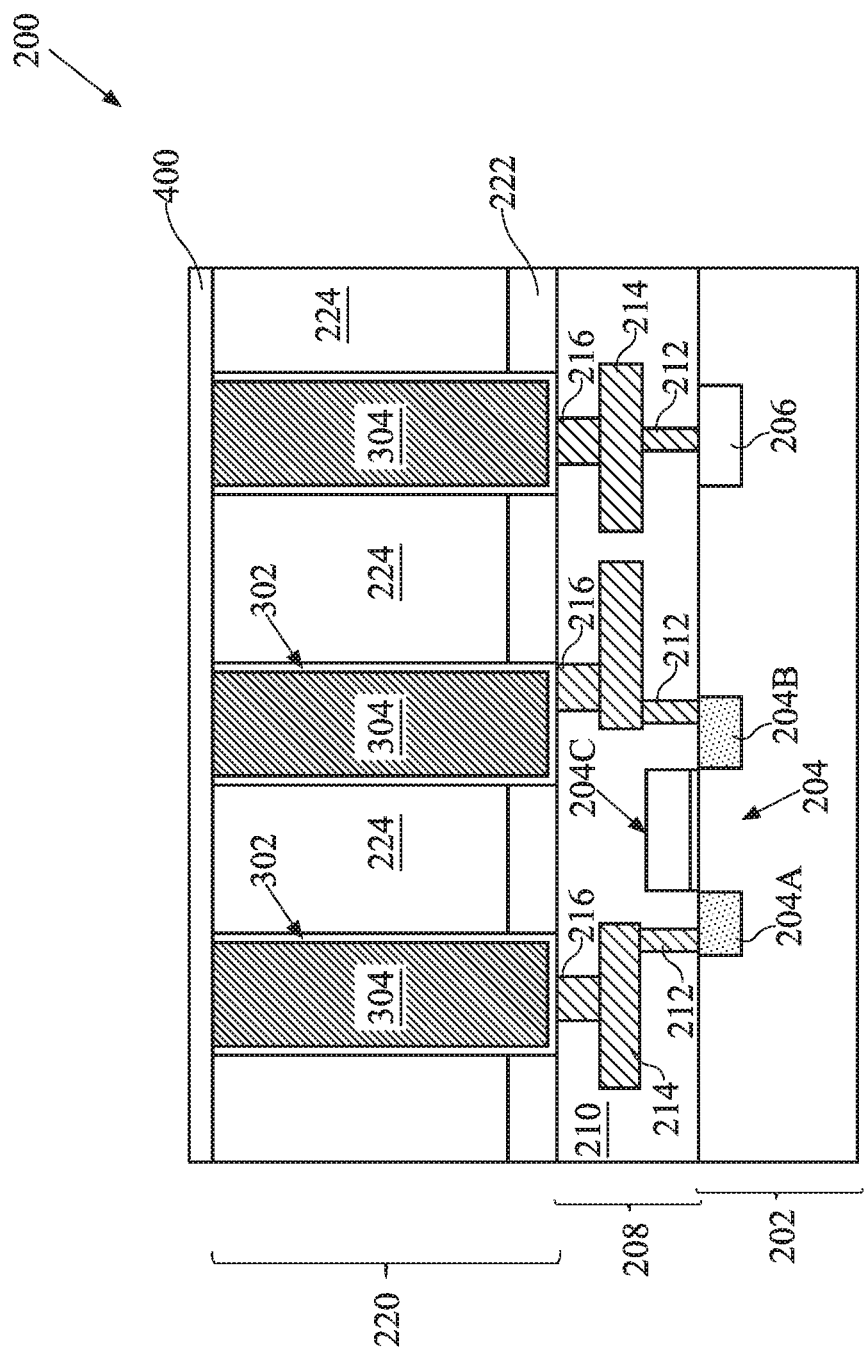

Referring back to FIGS. 1 and 4, the method 100 may include an operation 104 to form an etch stop layer 400 on the dielectric layer 220. The etch stop layer 400 is designed with a composition and a thickness to protect the metal features 300 formed in the dielectric layer 220 during various following operations, such as etching. In some examples, the etch stop layer 400 may include multiple films. The etch stop layer 400 may include a dielectric material, such as silicon nitride, silicon oxynitride, silicon carbide, other suitable materials, and/or a combination thereof.

Figure 5A:
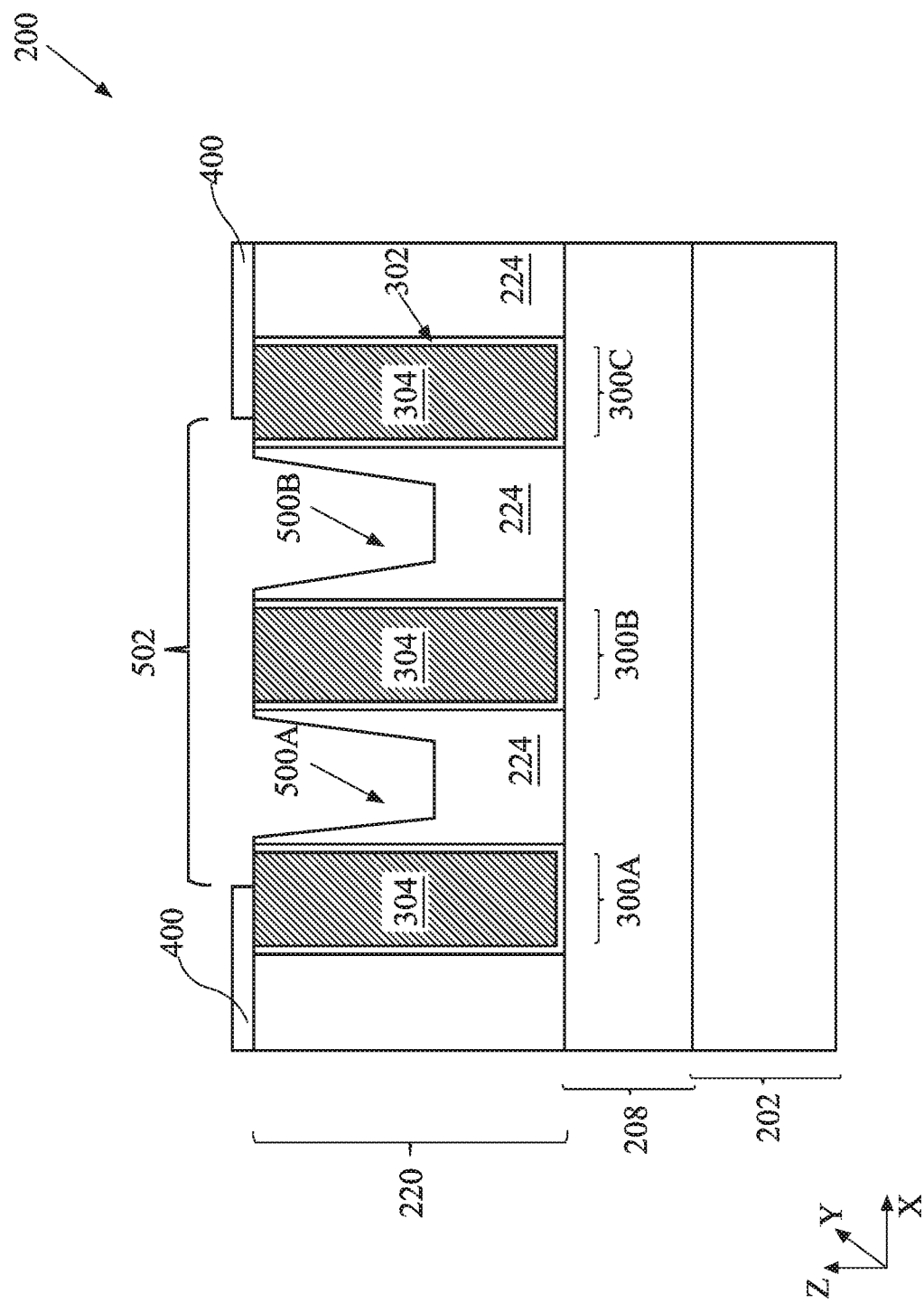

Referring to FIGS. 1 and 5A, the method 100 proceeds to an operation 106 to form one or more trench 500, such as two exemplary trenches 500A and 500B, in the dielectric layer 220. Various features in the substrate 202 and the interconnection structure 208 are eliminated in FIGS. 5A and 5B for better view. The formation of the trenches 500 includes patterning the etch stop layer 400 to form an opening 502 by a lithography patterning process; and etching the dielectric layer 220 to form the trenches 502. In the present embodiment, the patterned etch stop layer 400 is used as an etch mask during the etching process. In some embodiments, the etching process includes a dry etching process using a fluorine-containing etchant and a wet etching process using a suitable etchant. For examples, the dry etching process is applied to etch the low-k dielectric layer 224, using the fluorine-containing etchant, such as $C_xF_y$, where x and y are proper integers. For example, $C_xF_y$ is $CF_4$. The etchant in the dry etching process may additionally include oxygen. The etchant of the wet etching process includes hydrofluoric acid (HF), such as a solution of HF, $H_2O_2$ and $H_2O$. In some embodiments, the wet etching process may be designed to opening the etch stop layer 222 and may include an etchant that selectively etches the etch stop layer 222. For examples, the etchant of the wet etching process includes hydrofluoric acid for the etch stop layer 222 of silicon oxide or phosphorous acid for the etch stop layer 222 of silicon nitride.

Figure 5B:
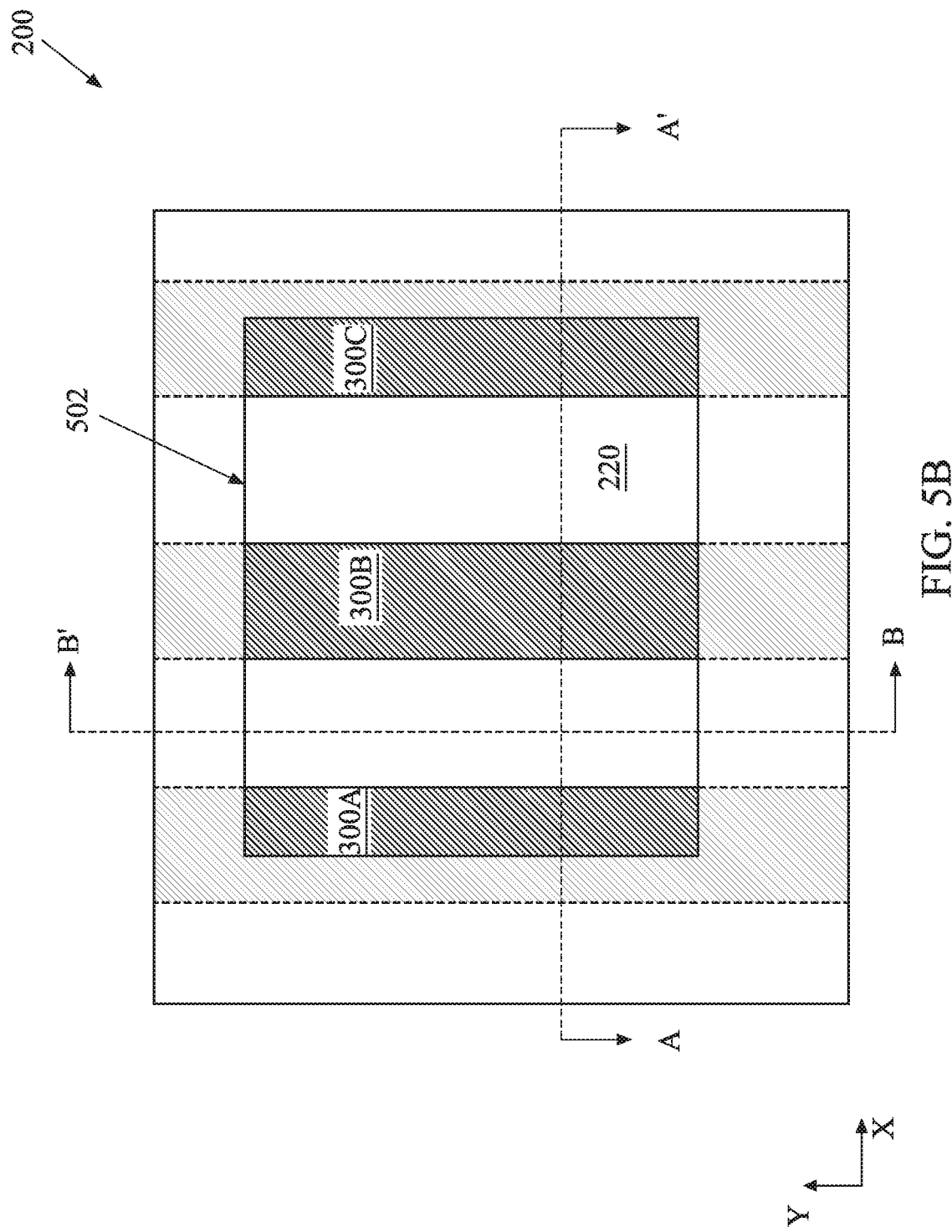
Figure 5C:
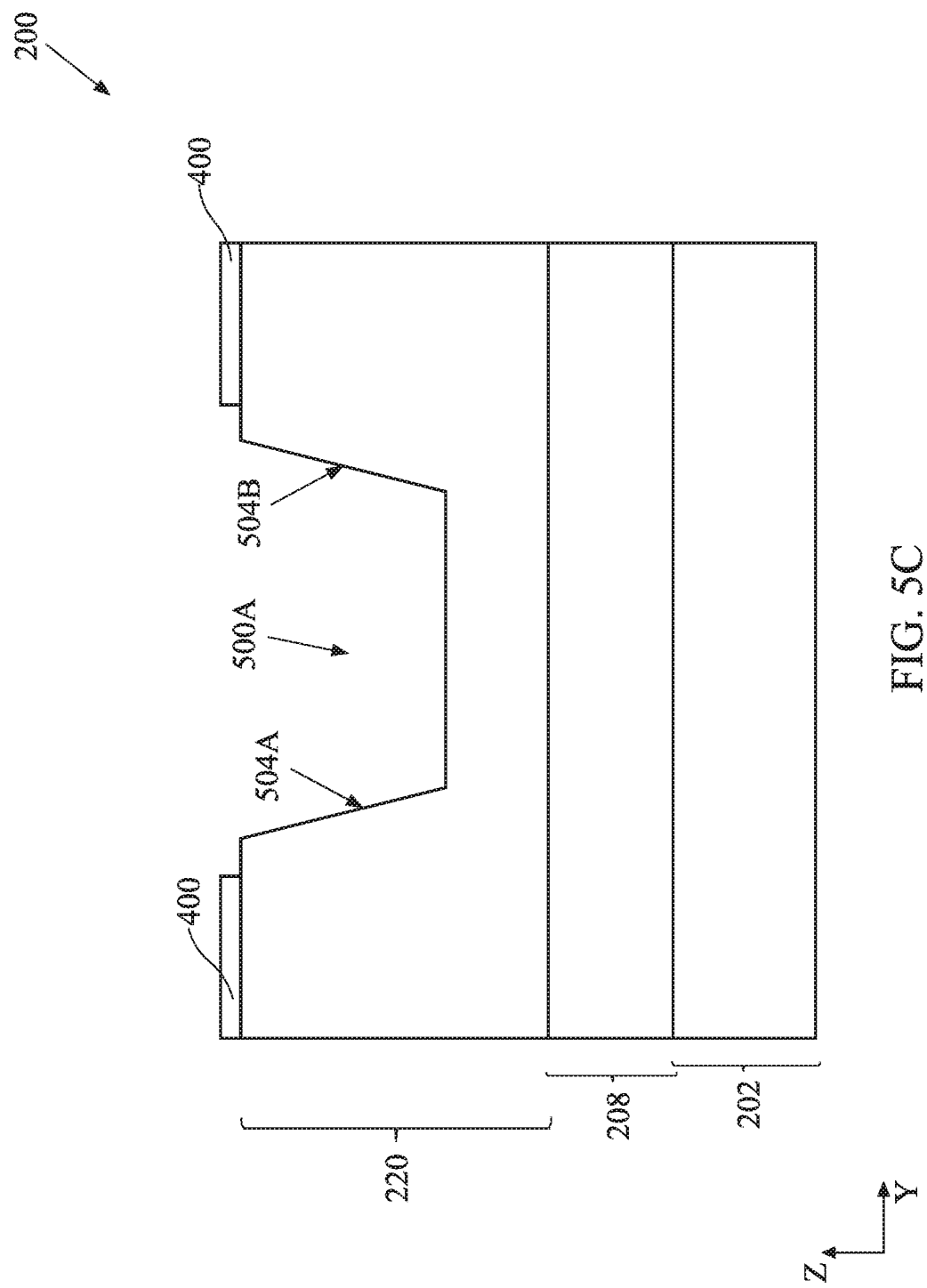

FIG. 5B is a top view of the semiconductor structure 200 in portion, constructed in accordance with some embodiments. FIG. 5A is a sectional view of FIG. 5B along the dashed line AA'. FIG. 5C is a sectional view of FIG. 5B is along the dashed line BB'. The opening 502 exposes one or more regions of the dielectric layer 220 between adjacent metal features 300. Taking the trench 500A as an example, the trench 500A spans from the metal features 300A to the metal feature 300B along the X direction and spans from the sidewall 504A to the sidewall 504B of the low-k dielectric layer 224 along the Y direction. X and Y are orthogonal to each other.

However, the etching process (such as wet etching or dry etching) may cause damage to the low-k dielectric layer 224 and reduce the carbon content of the low-k dielectric layer 224. For example, the dry etching removes and reduces the carbon content of the low-k dielectric layer 224 and the wet etching forms Si—OH bonding. The low carbon content leads to $H_2O$ and increases the dielectric constant of the low-k dielectric layer. Especially, the sidewalls 504A and 504B of the dielectric layer 220 are damaged, thereby rendering the low-k dielectric layer 224 to leakage issue, such as leakage between the metal features 300A and 300B through the damaged sidewalls.

Referring back to FIGS. 1 and 6, the method 100 proceeds to an operation 108 to perform a treatment process 600 to the low-k dielectric layer 224, particularly the sidewalls of the low-k dielectric layer 224. In the present embodiment, the treatment process 600 includes an ultraviolet (UV) treatment. In some embodiments, the treatment process may include an UV treatment process, an e-Beam treatment process, a thermal treatment, other suitable treatment process, and/or a combination thereof.

In some embodiment, the UV treatment includes irradiating an UV radiation on to the sidewalls of the first low-k dielectric layer; and supplying a first gas containing a $CH_3$ chemical group to the first low-k dielectric layer during the irradiating of the UV radiation. In the present example, the first gas containing the $CH_3$ chemical group includes a gas selected from the group consisting of a methylsilane ($SiCH_6$), dimethylsilane ($SiC_2H_8$), a trimethylsilan ($SiC_3H_{10}$), a tetramethylsilane ($SiC_4H_{12}$) and a combination thereof. In some examples, the UV treatment additionally includes supplying a second gas to carry on the first gas to the sidewalls of the first low-k dielectric layer. The second gas is an inert gas, such as nitrogen or argon. In some embodiment, the UV treatment includes irradiating an UV radiation to the sidewalls (504A and 504B) of the first low-k dielectric layer 224 from an UV radiation source having a spectrum to effectively break Si—$CH_3$ bond (of the first gas) and O—H bond of the low-k dielectric layer 224.

Figure 7:
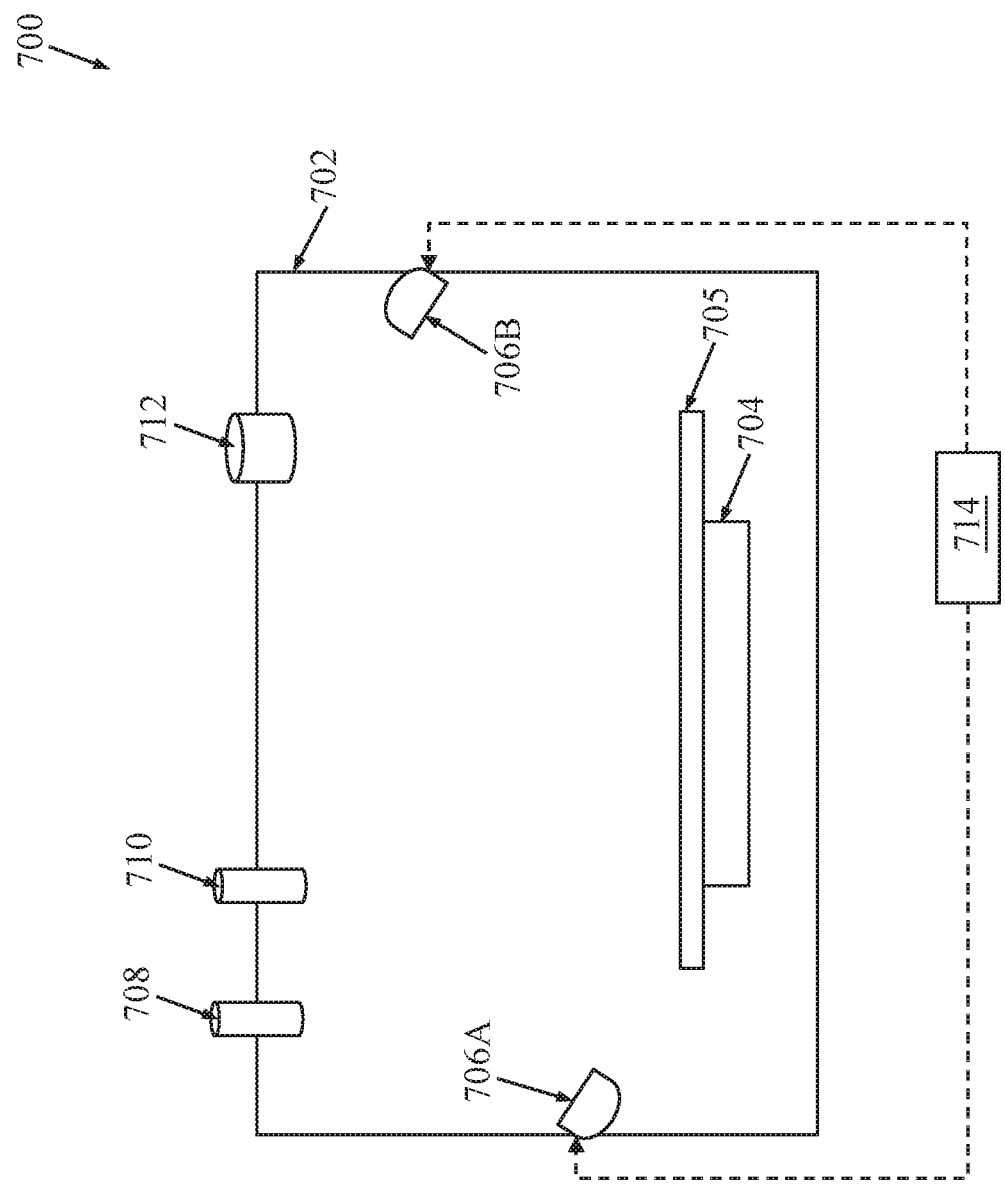
FIG. 7 is a schematic view of a semiconductor fabrication system, constructed according to some embodiments.

The treatment process may be performed in a production tool that is also used for PECVD, atomic layer deposition (ALD), LPCVD, etc. Referring to the example of FIG. 7, in some embodiments, a UV treatment process is performed to the low-k dielectric layer 224 in an UV treatment apparatus 700. The UV treatment apparatus 700 includes a processing chamber 702 and a substrate stage 704 configured in the processing chamber 702. The substrate stage 704 is operable to secure a semiconductor wafer 705, such as the semiconductor structure 200, and rotates the semiconductor wafer 705 secured thereon.

Figure 8:
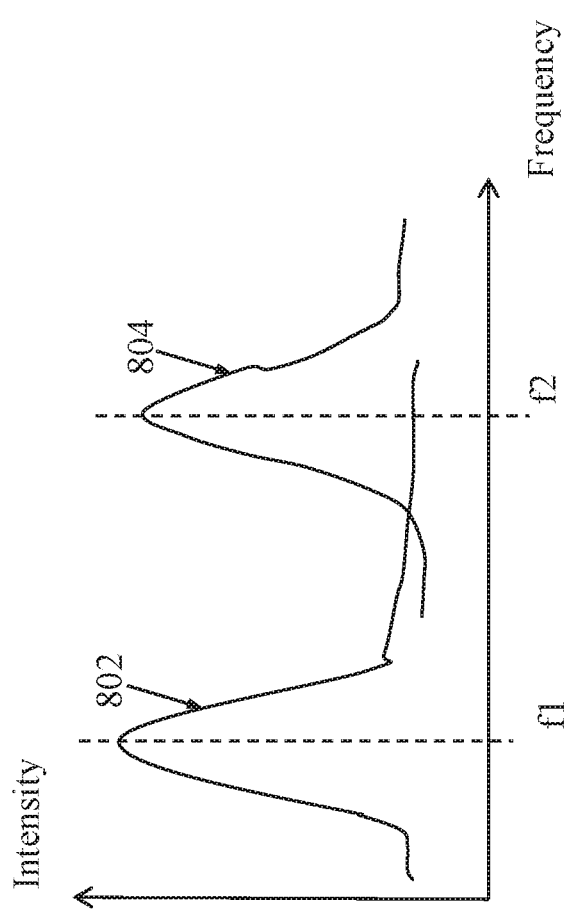
FIG. 8 is a diagram illustrating spectrums of the UV sources of the semiconductor fabrication system in FIG. 7 according to some embodiments.

The UV treatment apparatus 700 includes an UV source to irradiate the low-k dielectric layer 224 with UV radiation. The UV source may be a single excimer lamp or a broad spectrum source with arc or microwave excitations. In some embodiments, a filter may be used to selectively remove undesired wavelengths from the UV radiation. In some embodiments, the UV source includes a single UV source with a spectrum to effectively break Si—CH$_3$ bond and O—H bond. In some embodiments, the UV source includes two or more UV sources, such as UV sources 706A and 706B with different spectrums. For example, the UV source 706A has a first spectrum to effectively break Si—CH$_3$ bond from the first gas and the UV source 706B has a second spectrum to effectively break O—H bond. In furtherance of the embodiments, the first UV source 706A has a first spectrum 802 and the second UV source 706B has a second spectrum 804, as illustrated in FIG. 8. The first spectrum 802 has a peak at a first central frequency f1 and the second spectrum 804 has a peak at a second central frequency f2 different from the first central frequency f1, such as greater than f1. For example, the photon energy h*f1 at the first central frequency f1 is about or greater than the bond energy of the Si—CH$_3$ bond, such as about 310 KJ/mol for Si—C bond energy of Si—CH$_3$; and the photon energy h*f2 at the second central frequency f2 is about or greater than the bond energy of the O—H bond, such as about 459 kJ/mol.

In some embodiments, the UV irradiation may be performed in a vacuum environment or in an environment containing an inert gas, He, Ne, Ar, Kr, Xe, Rn, or a combination thereof. Referring back to FIG. 7, the UV treatment apparatus 700 includes a first supply mechanism 708 coupled to a source of the first gas (containing CH$_3$ group) to provide the first gas. In the present embodiment, the UV treatment apparatus 700 further includes a second supply mechanism 710 coupled to a source of the second gas (an inert gas) to provide the second gas. In the present embodiment, the UV treatment apparatus 700 also includes an exhaust mechanism 712, such as an air pump to remove the gases and maintain a proper pressure in the processing chamber 702. The UV treatment apparatus 700 may also include a controller 714 coupled with the UV sources 706A and 706B and is operable to control the powers of the UV sources for optimized treatment effect.

Figure 9:
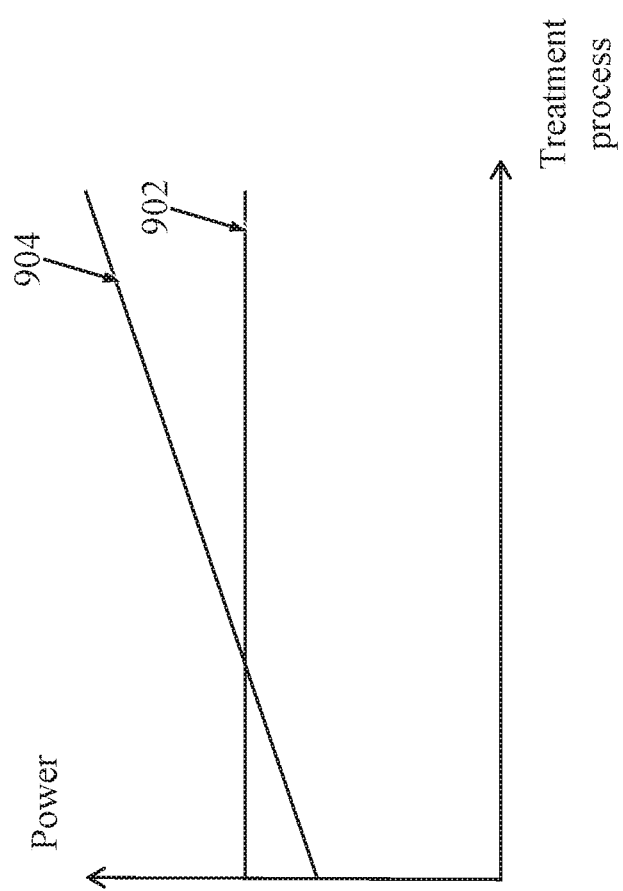
FIG. 9 is a diagram illustrating powers of the UV sources of the semiconductor fabrication system in FIG. 7 according to some embodiments.

In some embodiments, the UV treatment process may be controlled (e.g., by controlling the radiation wavelength(s), exposure time, power intensity, temperature, pressure) so that the treated low-k dielectric layer 224 has desired properties (e.g., increased carbon concentration). The controller 714 may control the powers of the UV sources 706A and 706B dynamically over the treatment process. For example, as illustrated in FIG. 9, the first UV source 706A has a first power 902 at about a same level but the second UV source 706B has a second power 904 increased over the treatment process 600 because more power is needed when the chemical reaction goes deeper from the sidewalls 504A and 504B during the UV treatment. The horizontal axis presents time of the treatment process 600. In some example, the total time of the UV treatment process ranges from 10 seconds to 60 seconds. In some examples, the semiconductor structure 200 is heated to a high temperature ranging between 200° C. and 400° C. during the UV treatment. The high temperature is caused by heating, UV irradiation or both collectively.

In some examples, the UV treatment conditions include a temperature of between about 200° C. and about 400° C., and a process time of between about 10 seconds and about 60 seconds. In a particular example, the UV treatment process is performed in the processing chamber 702 pumped to a pressure lower than $10^{-3}$ torr before applying the UV treatment.

Figure 6:
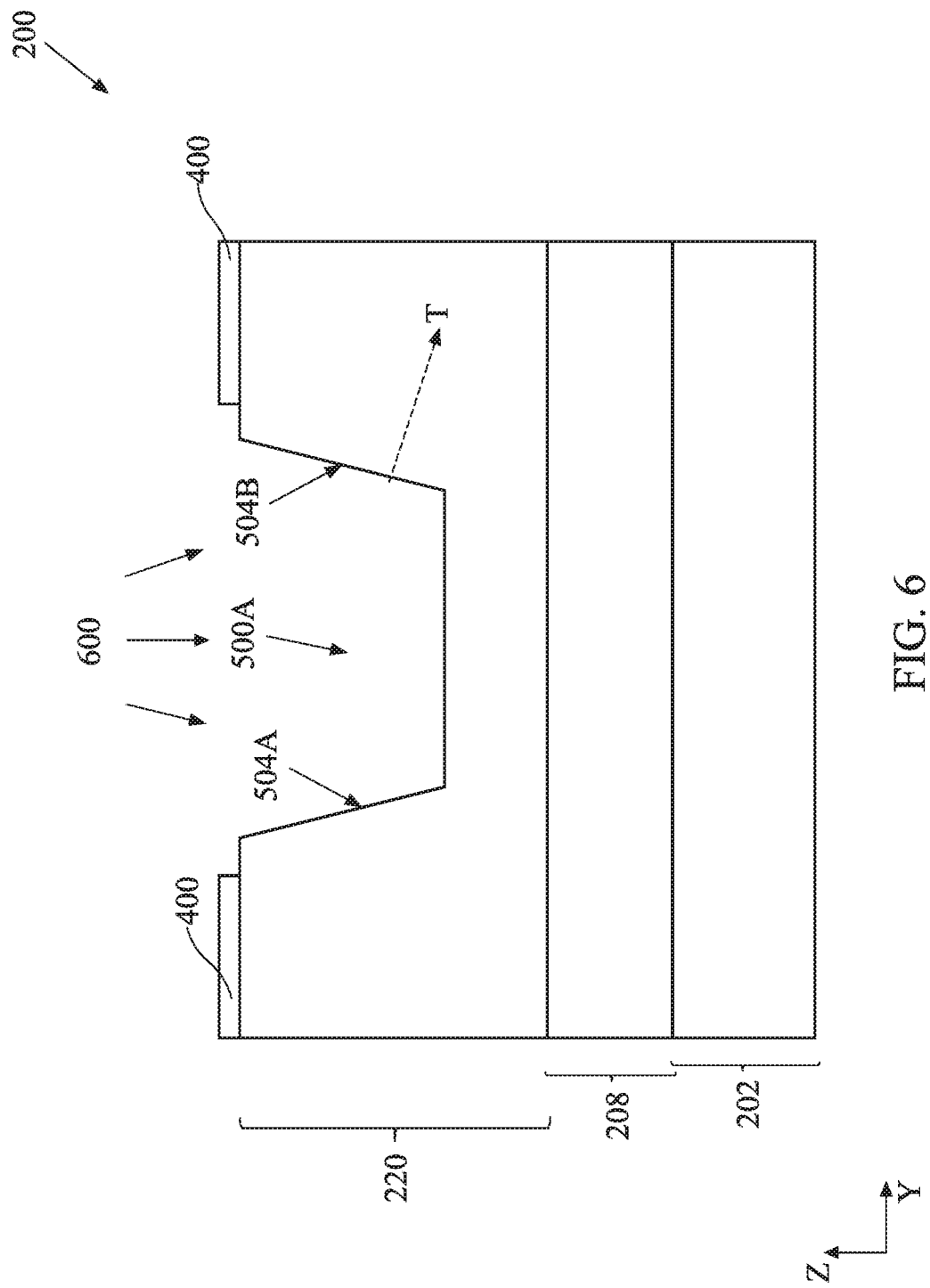
Figure 10:
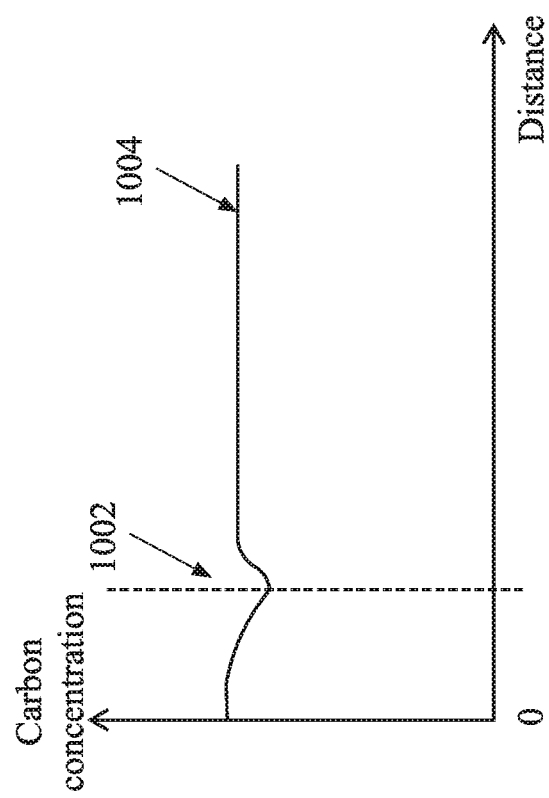
FIG. 10 is a diagram illustrating a carbon concentration profile of a low-k dielectric layer of the semiconductor structure in FIG. 6 according to some embodiments.

Referring back to FIG. 6, the UV treatment process 600 recovers the carbon loss of the low-k dielectric layer 224. As noted above, the etching process applied to the low-k dielectric layer 224 causes the carbon loss and changes the low-k dielectric layer to be hydrophilic. This further causes water absorption to the low-k dielectric layer and renders it conductive, leading to the leakage issues. The UV treatment 600 introduces carbon to the low-k dielectric layer 224 from the sidewalls (504A and 504B) and increases the carbon content therein. In a particular embodiment, as carbon is introduced from the sidewalls 504A and 504B, the carbon concentration is graded in the low-k dielectric layer 224 from the sidewalls to the bulky portion, such as from the sidewall 504B along the direction "T", as illustrated in FIG. 6. This is further illustrated in FIG. 10. The horizontal axis represents a distance from the sidewall 504A and 504B (at "0" distance) to the bulky low-k dielectric layer along "T" direction and the vertical axis represents the carbon concentration. The carbon concentration is higher at the sidewalls 504A and 504B; goes down to a dip at a location 1002 away from the sidewalls 504A and 504B; and then increase to a carbon concentration 1004 of the bulky portion of the low-k dielectric layer 224.

Figure 11:
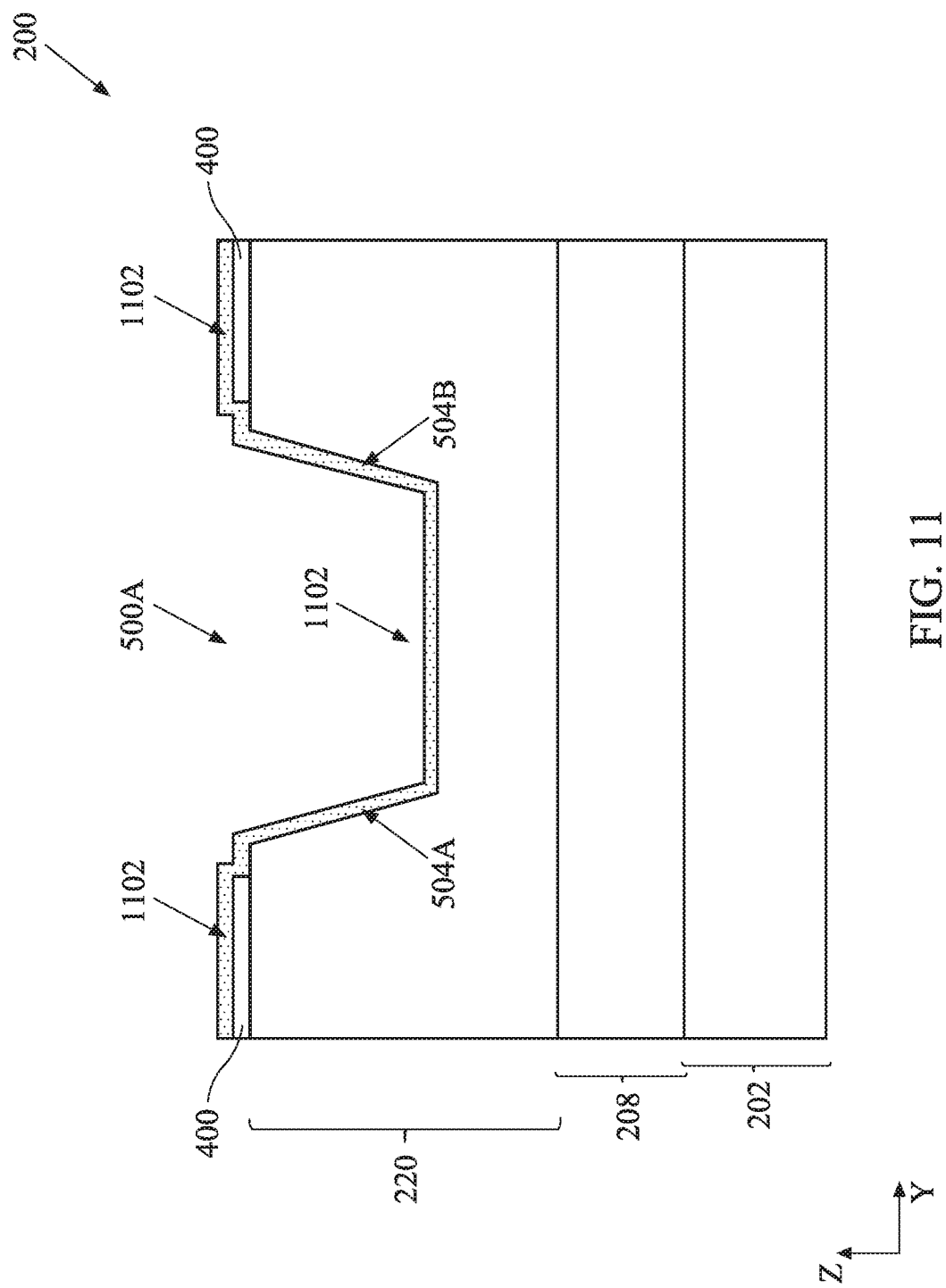

Referring to FIGS. 1 and 11, the method 100 may proceed to an operation 110 to form a dielectric layer 1102, such as an etch stop layer. The dielectric layer 1102 may be similar to the etch stop layer 400 in terms of composition and deposition. For example, the dielectric layer 1102 includes silicon oxide, silicon nitride, silicon oxynitride, other suitable material or a multilayer of a combination thereof. The dielectric layer 1102 has a thickness to control the proper formation of air gap at later stage. In some examples, the dielectric layer 1102 has a thickness ranging between 10 nm and 50 nm. In the present embodiment, the dielectric layer 1102 is conformal to the trench 500A.

Referring to FIGS. 1, 12A, 12B and 12C, the method 100 proceeds to an operation 112 to form air gap 1202 in a second low-k dielectric layer 1204. The operation 112 includes depositing a second low-k dielectric layer 1204, such as by CVD. The deposition is tuned with deposition rate and profile such that the second low-k dielectric layer closes up when filling the trench 500, thereby forming the air gap 1202 surrounded by the second low-k dielectric layer 1204 within the trench 500.

The operation 112 may further include a curing process applied to the second low-k dielectric layer 1204 after deposition. In various embodiments, the curing process includes a thermal annealing, UV radiation or a combination thereof, such as UV assisted annealing process. The UV radiation at the operation 112 is different from the UV treatment at the operation 108 in terms of functions, UV spectrum, power and duration and gas supply. For example, the UV assisted annealing includes using a monochromatic UV source with intensity maximum at λ1 nm and a broadband UV source with intensity spectrum distributed below λ2. After the deposition and curing, the operation 112 may further include a CMP process to planarize the top surface of the semiconductor structure 200.

Figure 12A:
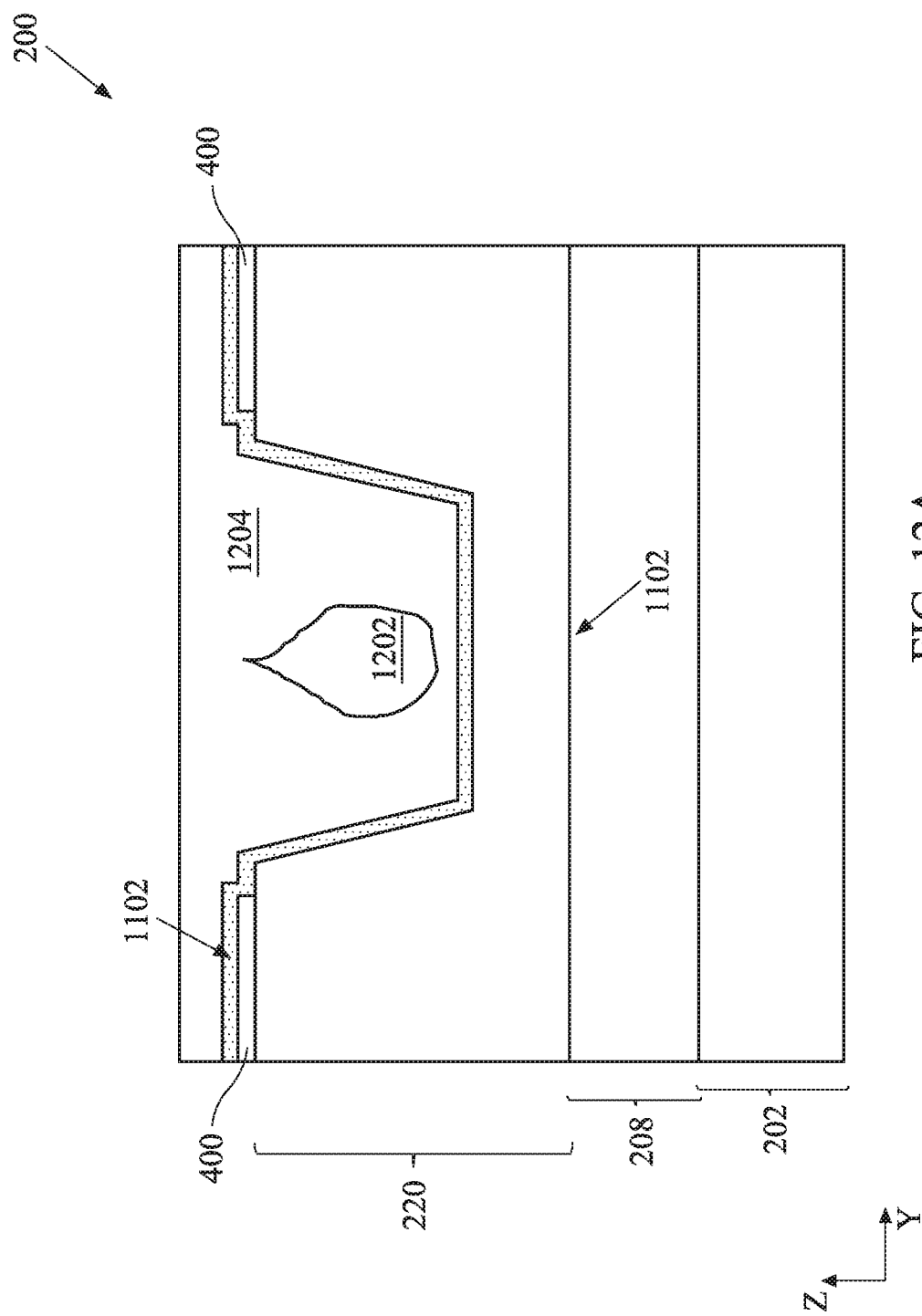
Figure 12B:
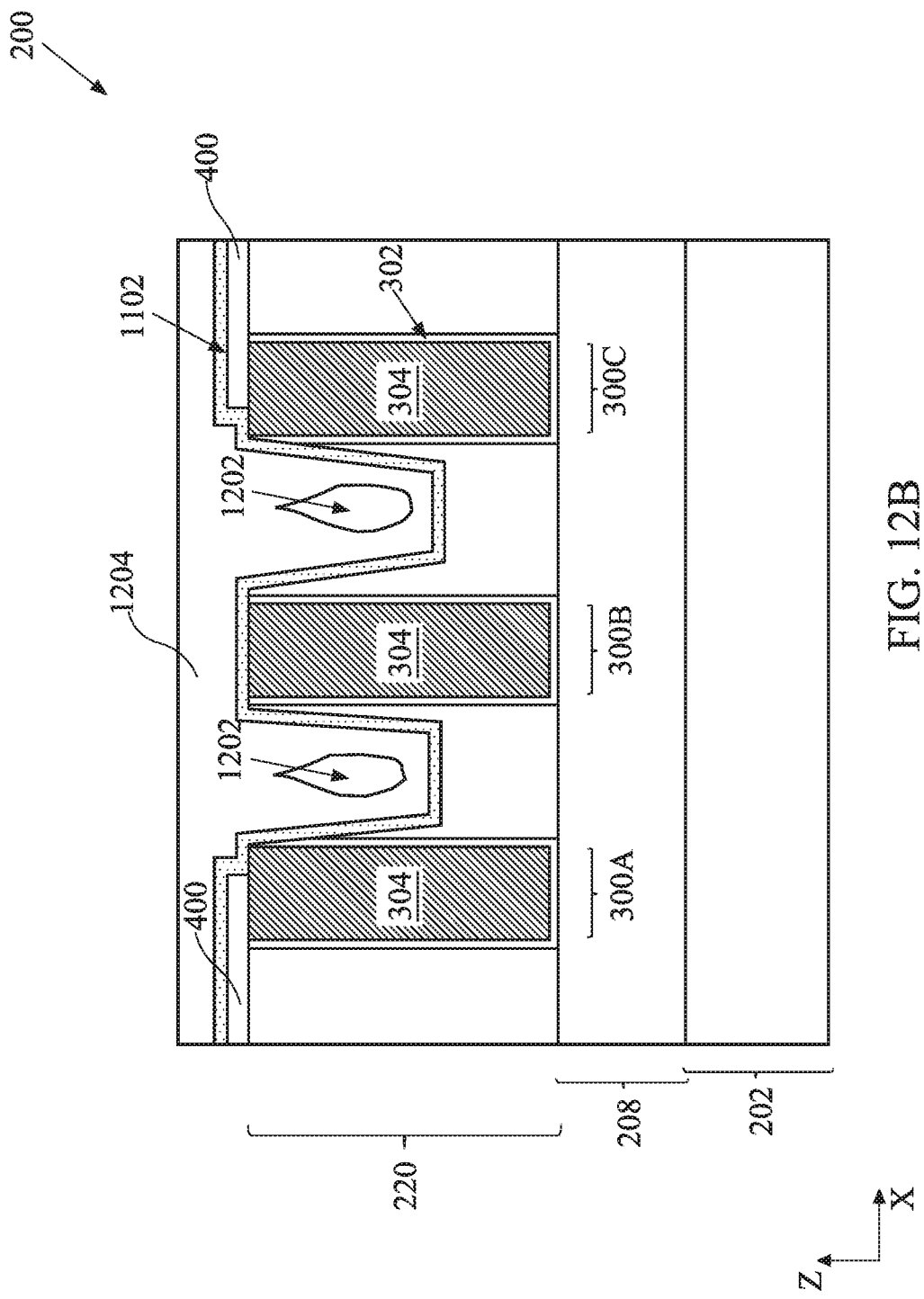
Figure 12C:
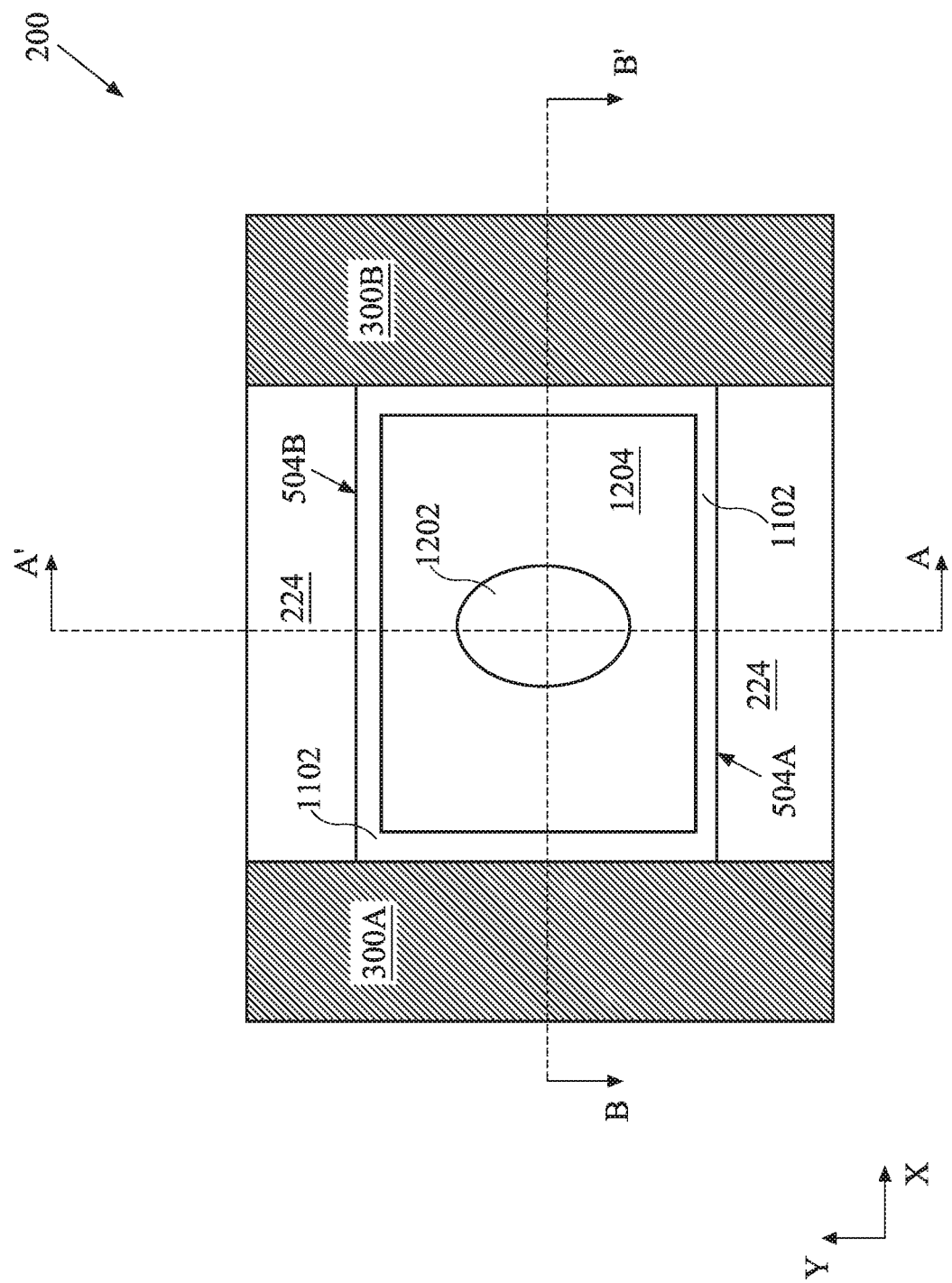

FIG. 12C is a top view of the semiconductor structure 200 in portion (only a portion from the metal feature 300A to the metal feature 300B), constructed in accordance with some embodiments. FIG. 12A is a sectional view of the semiconductor structure 200 along the dashed line AA' in FIG. 12C and FIG. 12B is a sectional view of the semiconductor structure 200 along the dashed line BB' in FIG. 12C. In FIG. 12C, the air gap 1202 is surrounded by the second low-k dielectric layer 1204, which is further surrounded by the dielectric layer 1102 in the region (corresponding to the trench 500, also referred to as trench region) defined by the adjacent metal features 300 and the first low-k dielectric layer 224. This trench region spans from the metal feature 300A to the metal feature 300B along the X direction and spans from the sidewall 504A to the sidewall 504B of the first low-k dielectric layer 224 along the Y direction. Especially, the carbon concentration of the first low-k dielectric layer 224 is graded from the sidewall to the bulky portion, as described in FIG. 10.

Figure 13A:
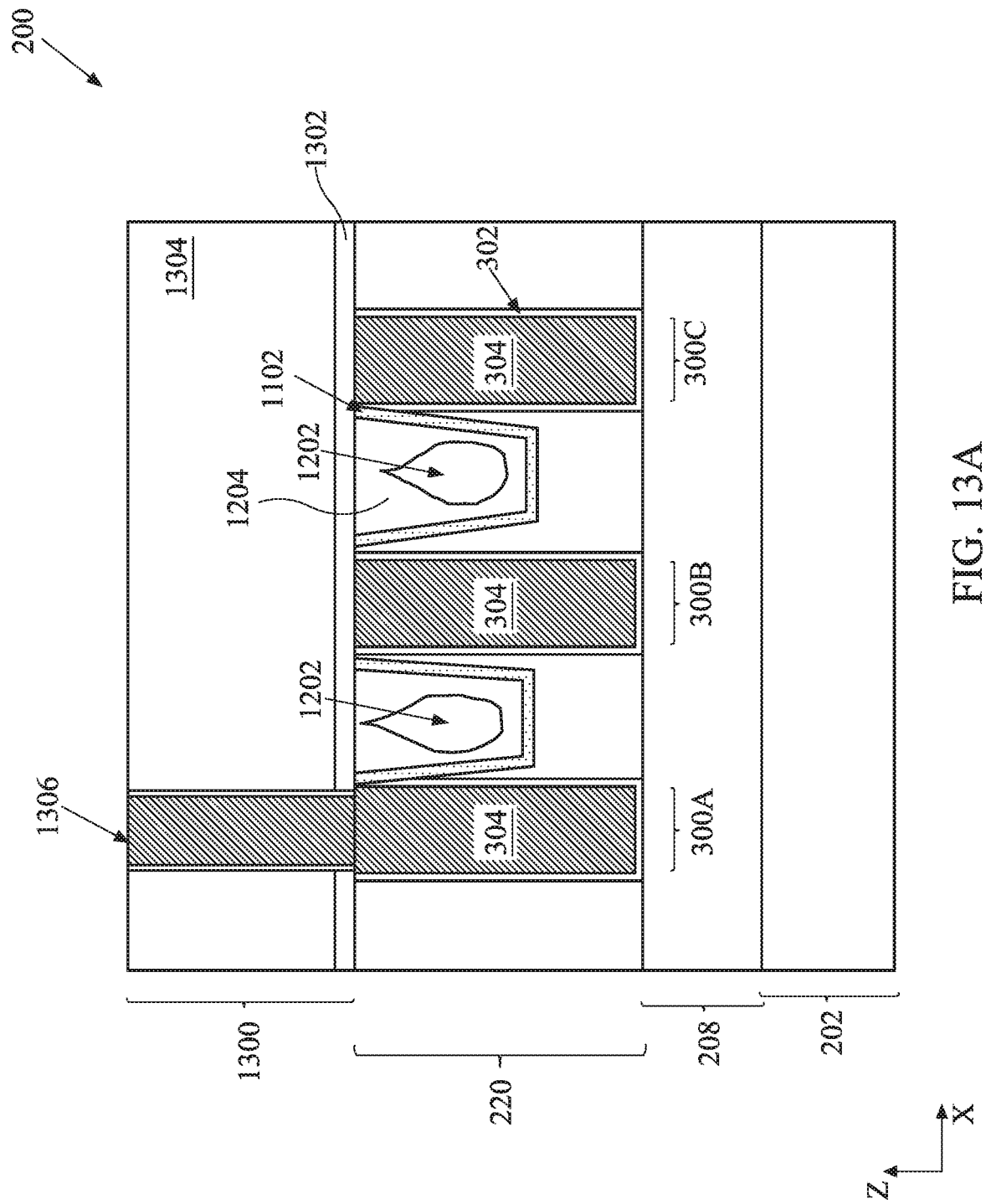

The method 100 may include other operations before, during or after the above operations. Referring to FIGS. 1 and 13A, the method 100 may proceed to another operation 114 to form one or more metal feature on the second low-k dielectric layer 1204. For example, a CMP process may be applied to remove the second low-k dielectric layer 1204 and other materials (such as etch stop layers 400 and 1102) to expose the metal features 300. The operation 114 includes forming a dielectric layer 1300 that may include an etch stop layer 1302 and a third low-k dielectric layer 1304 on the etch stop layer 1302. The operation 114 further includes patterning the dielectric layer 1300 to form one or more trench; filling a metal to the trench to form a metal feature 1306; and performing a CMP process to remove the excessive metal and planarize the top surface. The formation of the metal feature 1306 may be similar to the formation of the metal features 300. The metal feature 1306 may be a via feature landing on the metal feature 300A and connects the metal feature 300A to a metal line on the overlying metal layer. The metal feature 1306 may include multiple layers, such as a barrier layer and bulky metal surrounded by the barrier layer. The operation 114 may further include operations to form one or more air gap between adjacent metal features 1306 in a procedure similar to the procedure to form the air gaps 1202.

Figure 13B:
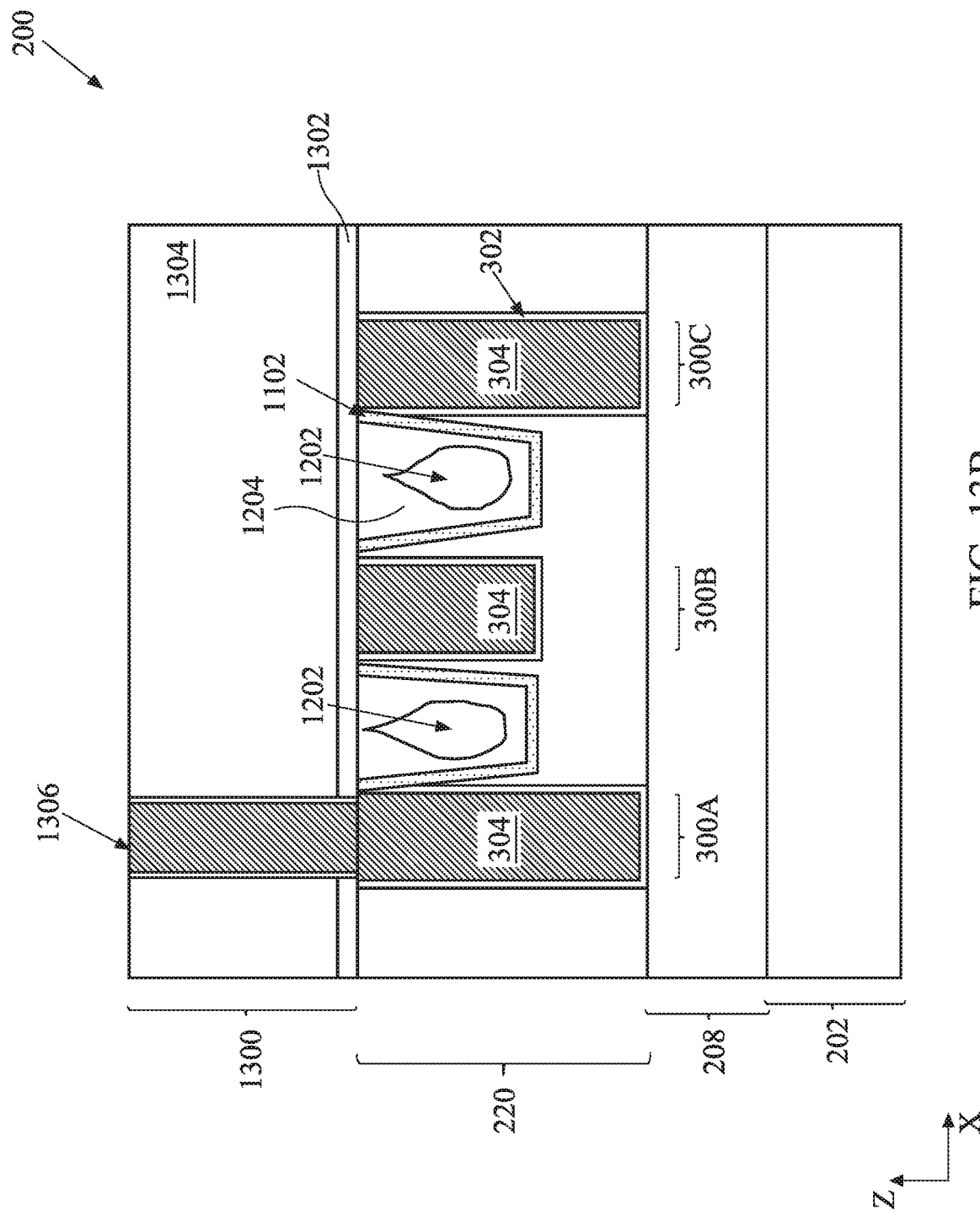

Although not shown, other processing operations may be presented to form various doped regions such as source and drain regions and/or devices features such as gate electrode. In one example, the substrate may alternatively include other material layer to be patterned by the disclosed method, such as another patterned metal layer. In another example, additional patterning steps may be applied to the substrate to form a gate stack. In another example, various metal features, such as metal features 300, may include metal lines and via features formed by a dual damascene process, such as one illustrated in FIG. 13B. In FIG. 13B, the metal feature 300B is a metal line while the metal features 300A and 300C includes metal lines and metal vias.

A semiconductor structure with an air gap and a method making the same are disclosed. The method includes an UV treatment to the sidewalls of the first low-k dielectric layer 224 and the air gaps 1202 are formed between the treated sidewalls of the first low-k dielectric layer 224. The first low-k dielectric layer 224 has a graded carbon concentration from the sidewalls 504A and 504B to the bulky portion of the first low-k dielectric layer 224. The UV treatment apparatus 700 may be used to implement the UV treatment.

Various advantages may be present in various applications of the present disclosure. No particular advantage is required for all embodiments, and that different embodiments may offer different advantages. One of the advantages in some embodiments is that the carbon loss of the first low-k dielectric layer 224 is recovered and the leakage issue is eliminated.

In one aspect, the present disclosure provides a semiconductor structure that includes a first low-k dielectric layer disposed over a semiconductor substrate, a first conductive feature and a second conductive feature disposed in the first low-k dielectric layer, a second low-k dielectric layer disposed in the first low-k dielectric layer and interposed between the first conductive feature and the second conductive feature, where the second low-k dielectric layer includes an air gap, and an etch-stop layer disposed at an interface between the first low-k dielectric layer and the second low-k dielectric layer. In the present embodiments, the first low-k dielectric layer includes carbon whose concentration is graded in a direction away from the etch-stop layer.

In another aspect, the present disclosure provides a semiconductor structure that includes a first dielectric layer disposed over an interconnect structure, a first metal feature and a second metal feature disposed in the first dielectric layer, a second dielectric layer disposed in the first dielectric layer, thereby separating the first and the second metal features, an air gap enclosed in the second dielectric layer, and an etch-stop layer defining boundaries between the first and the second low-k dielectric layers. In the present embodiments, the first dielectric layer includes a graded carbon concentration that varies with a distance away from the etch-stop layer.

In still another aspect, the present disclosure provides a semiconductor structure that includes a first low-k dielectric layer disposed over a semiconductor substrate, a first conductive feature and a second conductive feature disposed in the first low-k dielectric layer and separated along a first direction, a second low-k dielectric layer embedded in the first low-k dielectric layer and between the first and the second conductive features, where the second low-k dielectric layer includes an air gap, and an etch-stop layer disposed between the first and the second low-k dielectric layers, where the etch-stop layer includes a set of sidewalls separated along a second direction substantially perpendicular to the first direction. In the present embodiments, the first low-k dielectric layer includes carbon and a concentration of carbon varies with a distance away from the set of sidewalls.

In yet another aspect, the present disclosure provides a semiconductor fabrication apparatus that includes a processing chamber, a substrate stage configured in the processing chamber to secure a semiconductor wafer, a chemical supply connected to the processing chamber and configured to deliver a gas containing Si—$CH_3$ bonds to the processing chamber, a first ultraviolet (UV) source configured in the processing chamber to generate a first UV irradiation having a first spectrum, where the first UV irradiation is operable to break the Si—$CH_3$ bonds in the gas, and a second UV source configured in the processing chamber to generate a second UV irradiation having a second spectrum, where the second UV irradiation is operable to break O—H bonds in the low-k dielectric layer, and wherein the second spectrum is different from the first spectrum.

Although the present disclosure and advantages of some embodiments have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
a first low-k dielectric layer disposed over a semiconductor substrate, wherein the first low-k dielectric layer includes carbon;
a first conductive feature and a second conductive feature disposed in the first low-k dielectric layer;
a second low-k dielectric layer disposed in the first low-k dielectric layer and interposed between the first conductive feature and the second conductive feature;
an air gap embedded in the second low-k dielectric layer; and
an etch-stop layer disposed at an interface between the first low-k dielectric layer and the second low-k dielectric layer, wherein a concentration of carbon in the first low-k dielectric layer is graded in a direction away from the etch-stop layer.

2. The semiconductor structure of claim 1, wherein the etch-stop layer is a first etch-stop layer, the semiconductor structure further comprising:
a second etch-stop layer disposed over the first low-k dielectric layer;
a third low-k dielectric layer disposed over the second etch-stop layer; and
a third conductive feature disposed in the third low-k dielectric layer, wherein the third conductive feature extends through the second etch-stop layer to contact the first conductive feature or the second conductive feature.

3. The semiconductor structure of claim 2, wherein the second etch-stop layer defines a top surface of the second low-k dielectric layer.

4. The semiconductor structure of claim 1, wherein a bottom surface of the second low-k dielectric layer is above a bottom surface of the first low-k dielectric layer.

5. The semiconductor structure of claim 1, further comprising a barrier layer disposed at an interface between the first low-k dielectric layer and each of the first and the second conductive features.

6. The semiconductor structure of claim 1, wherein portions of the etch-stop layer are disposed between the second low-k dielectric layer and each of the first and the second conductive features.

7. The semiconductor structure of claim 1, wherein the concentration of carbon first decreases and then increases in the direction away from the etch-stop layer.

8. The semiconductor structure of claim 1, wherein a portion of the first low-k dielectric layer is disposed between the etch-stop layer and at least one of the first and the second conductive features.

9. A semiconductor structure, comprising:
a first dielectric layer disposed over an interconnect structure, wherein the first dielectric layer includes a graded carbon concentration;
a first metal feature and a second metal feature disposed in the first dielectric layer;
a second dielectric layer disposed in the first dielectric layer, thereby separating the first and the second metal features;
an air gap enclosed in the second dielectric layer; and
an etch-stop layer defining boundaries between the first and the second dielectric layers, wherein the graded carbon concentration varies with a distance away from the etch-stop layer.

10. The semiconductor structure of claim 9, wherein the etch-stop layer is a first etch-stop layer, the semiconductor structure further comprising a second etch-stop layer disposed over the first dielectric layer and in contact with top portions of the first etch-stop layer.

11. The semiconductor structure of claim 10, wherein the second dielectric layer is enclosed by the first and the second etch-stop layers.

12. The semiconductor structure of claim 9, wherein the air gap and each of the first and the second metal features are separated by at least the second dielectric layer and the etch-stop layer.

13. The semiconductor structure of claim 12, wherein the air gap and each of the first and the second metal features is further separated by the first dielectric layer.

14. The semiconductor structure of claim 9, wherein the first and the second metal features are separated along a first direction, wherein the etch-stop layer includes two sidewalls in contact with the first dielectric layer and separated along a second direction generally perpendicular to the first direction, and wherein the graded carbon concentration is at a maximum at the two sidewalls.

15. The semiconductor structure of claim 14, wherein the graded carbon concentration decreases from the maximum to a minimum in a bulky region of the first dielectric layer away from the two sidewalls along the second direction.

16. The semiconductor structure of claim 9, further comprising a third metal feature disposed in a third dielectric layer and electrically coupled to the first metal feature or the second metal feature.

* * * * *